United States Patent
Weitz

(10) Patent No.: US 6,897,101 B2
(45) Date of Patent: May 24, 2005

(54) METHOD FOR WRITING TO THE MAGNETORESISTIVE MEMORY CELLS OF AN INTEGRATED MAGNETORESISTIVE SEMICONDUCTOR MEMORY

(75) Inventor: Peter Weitz, Sauerlach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/685,064

(22) Filed: Oct. 14, 2003

(65) Prior Publication Data
US 2004/0087134 A1 May 6, 2004

Related U.S. Application Data

(63) Continuation of application No. PCT/DE02/01256, filed on Apr. 5, 2002.

(30) Foreign Application Priority Data

Apr. 11, 2001 (DE) .......................................... 101 18 197

(51) Int. Cl.$^7$ ............................................. H01L 21/338
(52) U.S. Cl. ........................ 438/171; 438/210; 438/381; 365/148; 365/157; 365/158
(58) Field of Search ........................ 438/48, 171, 210, 438/381, 620, 622; 365/148, 157, 158

(56) References Cited

U.S. PATENT DOCUMENTS

| | | | | |
|---|---|---|---|---|
| 5,587,943 A | * | 12/1996 | Torok et al. ................. | 365/158 |
| 5,640,343 A | * | 6/1997 | Gallagher et al. ........... | 365/171 |
| 6,211,559 B1 | | 4/2001 | Zhu et al. ..................... | 257/421 |
| 6,490,190 B1 | * | 12/2002 | Ramcke et al. ............. | 365/158 |
| 6,624,011 B1 | * | 9/2003 | Subramanian et al. ...... | 438/152 |
| 6,627,530 B2 | * | 9/2003 | Li et al. ...................... | 438/622 |
| 2002/0075719 A1 | * | 6/2002 | Johnson et al. ............. | 365/130 |
| 2003/0077891 A1 | * | 4/2003 | Drynan ........................ | 438/618 |
| 2003/0202404 A1 | * | 10/2003 | Scheuerlein ................. | 365/200 |
| 2004/0130935 A1 | * | 7/2004 | Gider et al. ................. | 365/158 |
| 2004/0130936 A1 | * | 7/2004 | Nguyen et al. ............. | 365/158 |

FOREIGN PATENT DOCUMENTS

| | | |
|---|---|---|
| EP | 1 061 592 A2 | 12/2000 |
| WO | 99/14760 | 3/1999 |

OTHER PUBLICATIONS

Roy E. Scheuerlein: "Magneto–Resistive IC Memory Limitations and Architecture Implications", *Proceedings of the 7$^{th}$ IEEE International Nonvolatile Memory Technology Conference*, Jun. 22–24, 1998, pp. 47–50.
S. Tehrani et al.: "Recent Developments in Magnetic Tunnel Junction MRAM", *IEEE Transactions on Magnetics*, vol. 36, No. 5, Sep. 2000, pp. 2752–2757.

* cited by examiner

*Primary Examiner*—W. David Coleman
*Assistant Examiner*—Khiem Nguyen
(74) *Attorney, Agent, or Firm*—Laurence A. Greenberg; Werner H. Stemer; Gregory L. Mayback

(57) ABSTRACT

An integrated magnetoresisitive semiconductor memory configuration has MRAM memory cells located at crossover points of selection lines that are embedded in different, mutually separate line planes. A read/write current can be impressed in respective selection lines for writing to each MRAM memory cell and for reading an information item written therein. In this magnetoresistive semiconductor memory configuration, selection lines that serve for reading a cell information item are in each case located in separate first and second line planes in direct contact with the memory cells. A third and a fourth line plane are spatially separated and electrically isolated from the first and second line planes and are occupied by write selection lines for writing a cell information item.

2 Claims, 2 Drawing Sheets

METHOD FOR WRITING TO THE MAGNETORESISTIVE MEMORY CELLS OF AN INTEGRATED MAGNETORESISTIVE SEMICONDUCTOR MEMORY

CROSS-REFERENCE TO RELATED APPLICATION

This application is a continuation of copending International Application No. PCT/DE02/01256, filed Apr. 5, 2002, which designated the United States and was not published in English.

BACKGROUND OF THE INVENTION

Field of the Invention

The invention relates to an integrated magnetoresistive semiconductor memory configuration, in particular, an MRAM (magnetoresistive random access memory) and to a method for writing to the magnetoresistive memory cells of an integrated semiconductor memory configuration of this type.

In an MRAM, the storage effect resides in the magnetically variable electrical resistance of the memory cell. In an MRAM cell concept that is currently customary, the memory cells are embedded in a matrix including selection lines, which are also called word lines and bit lines, and which run in different line planes.

The accompanying FIG. 2 shows the matrix-type basic MRAM cell concept that has been customary until now. An MRAM memory cell 10, for example an MTJ (Magnetic Tunnel Junction) cell, is situated at each crossover point of the selection lines 5 and 6 running in two mutually separate line planes 1 and 2. When writing to a specific memory cell 10, two currents I1, I2 are impressed in each case through an associated line 5 and 6 in each line plane 1 and 2 and—as a result of the superposition of the resulting magnetic fields of these two currents—lead to a process of writing to the cell at the crossover point of the two selection lines 5 and 6. The superposed magnetic fields lead to a magnetization reversal of the memory cell 10 that is situated at the crossover point of the two selection lines 5 and 6. Since the impressed write currents I1 to I2 are relatively large, a voltage drop forms along the selection lines 5, 6. This has the effect that a voltage is dropped across the cells 10 located on the selection lines, which voltage leads to undesirable leakage currents I1L and I2L through the cells.

SUMMARY OF THE INVENTION

It is accordingly an object of the invention to provide a method for writing to the magnetoresistive memory cells of an integrated magnetoresistive semiconductor memory configuration, which overcomes the above-mentioned disadvantages of the prior art methods of this general type.

It is also an object of the invention to provide an integrated magnetoresistive semiconductor memory configuration and also a method for writing to the memory cells of a semiconductor memory configuration of this type such that the leakage currents can at least be reduced and preferably nullified.

The integrated magnetoresitive semiconductive memory configuration reduces the leakage currents by using additional line planes in which the selection lines for writing to the cell array are situated. In other words the selection lines for reading a cell information item, which require a direct electrical contact with the cell, are electrically isolated and spatially separated from the selection lines for writing a cell information item, which do not need a direct electrical contact.

The integrated magnotoresistive semiconductor memory configuration may have a third and fourth line plane in each case above and below the first and second line planes, which contain the read selection lines that are in direct contact with the MRAM memory cell for reading purposes. The third line plane is electrically decoupled from the other line planes. The write selection lines running in this additional line plane are electrically decoupled from the other line planes. The voltage drop along the write selection line through which current flows does not lead to a leakage current through the MRAM cell array. As a result of this, the overall leakage current that occurs in the integrated magnetoresistive semiconductor memory configuration is approximately halved.

By virtue of the electrical decoupling of the write selection lines running in the third and fourth line planes with respect to the intervening cells, the voltage drop along the write selection lines through which current flows does not lead to leakage currents through the cell array.

What is special about this structure is that the selection lines for writing to the cell array are electrically decoupled from those for reading. That is to say that the selection lines which make direct contact with the MRAM memory cells continue to be utilized for reading a cell information item. This also opens up the possibility of writing and reading information items in parallel.

The structure of the inventive integrated magnetoresistive semiconductor memory configuration is thus based on the idea of using the particular writing mechanism of MRAM memory cells in order to reduce the leakage current through the memory cell array during writing. This can be accomplished since the magnetic field around a conductor through which current flows is utilized for writing to MRAM cells, and an electrical contact with the memory cell is necessary only for reading an information item stored in an MRAM memory cell. Depending on the particular use, it may be advantageous to configure the write selection lines in the third and/or fourth line plane to be not parallel with the associated read selection lines adjoining the MRAM cells. An angle of 90°, for example, may reduce the electrostatic coupling between the selection lines, which otherwise run densely one above the other. Different angles than 90° may possibly lead to resulting magnetic fields that have a more favorable spatial orientation.

A method for writing to a magnetoresitive memory cell, which has the structure proposed above, may include, in addition to impressing a main write current through a respective write selection line in the third and/or fourth line plane, impressing a small additional write current through the (read) selection lines adjoining the MRAM memory cells. This additional write current must in each case flow in the same direction as the main current.

In this case, the current intensity of the small additional write current may advantageously be chosen such that the maximum voltage drop along the selection line adjoining the MRAM memory cell lies in the region of high resistance of the current-voltage characteristic curve of the MRAM memory cell. The current-voltage characteristic curve through an MRAM memory cell is nonlinear and similar to a diode characteristic curve. The writing method therefore proposes that, in addition to the (main) write current through the third/fourth line plane, a small (additional) write current is impressed in the selection lines adjoining the MRAM cells. In this case, it is advantageous to hold the maximum voltage drop along the selection line adjoining the MRAM cells such that one is in a region of the characteristic curve of the memory cell with high resistance. This results in minimizing any leakage current that flows.

With the foregoing and other objects in view there is provided, in accordance with the invention, a method for writing to magnetoresistive memory cells. The method includes providing an integrated magnetoresistive semiconductor memory configuration having MRAM memory cells located at crossover points between first selection lines embedded in a first line plane directly contacting the MRAM memory cells and second selection lines embedded in a second line plane directly contacting the MRAM memory cells. The second line plane is separate from the first line plane. The first selection lines and the second selection lines are for impressing read/write currents for writing information items to the MRAM memory cells and for impressing read/write currents for reading the information items from the MRAM memory cells. The integrated magnetoresistive semiconductor memory configuration is provided with a third line plane being spatially separated and electrically isolated from the first line plane and the second line plane. The third line plane is provided with write selection lines for writing a cell information item. The integrated magnetoresistive semiconductor memory configuration is provided with a fourth line plane being spatially separated and electrically isolated from the first line plane, the second line plane, and the third line plane. The fourth line plane is provided with write selection lines for writing a cell information item.

A main write current is impressed in a direction through one of the write selection lines in the third line plane and through one of the write selection lines in the fourth line plane for writing to a particular one of the MRAM cells, while an additional write current is also impressed through the one of the first selection lines adjoining the particular one of MRAM memory cells and through the one of the second selection lines adjoining the particular one of MRAM memory cells. The additional write current is small compared to the main write current and is impressed in the same direction as the main write current.

In accordance with an added feature of the invention, when impressing the additional write current, the current intensity of the additional write current is set such that a maximum voltage drop is established along the one of the first selection lines adjoining the particular one of MRAM memory cells and along the one of the second selection lines adjoining the particular one of MRAM memory cells. A current-voltage characteristic curve of the particular one of MRAM memory cells has a region of high resistance and a region of low resistance. It is ensured that the maximum voltage drop lies in the region of high resistance in the current-voltage characteristic curve of the particular one of MRAM memory cells.

Other features which are considered as characteristic for the invention are set forth in the appended claims.

Although the invention is illustrated and described herein as embodied in a method for writing to the magnetoresistive memory cells of an integrated magnetoresistive semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
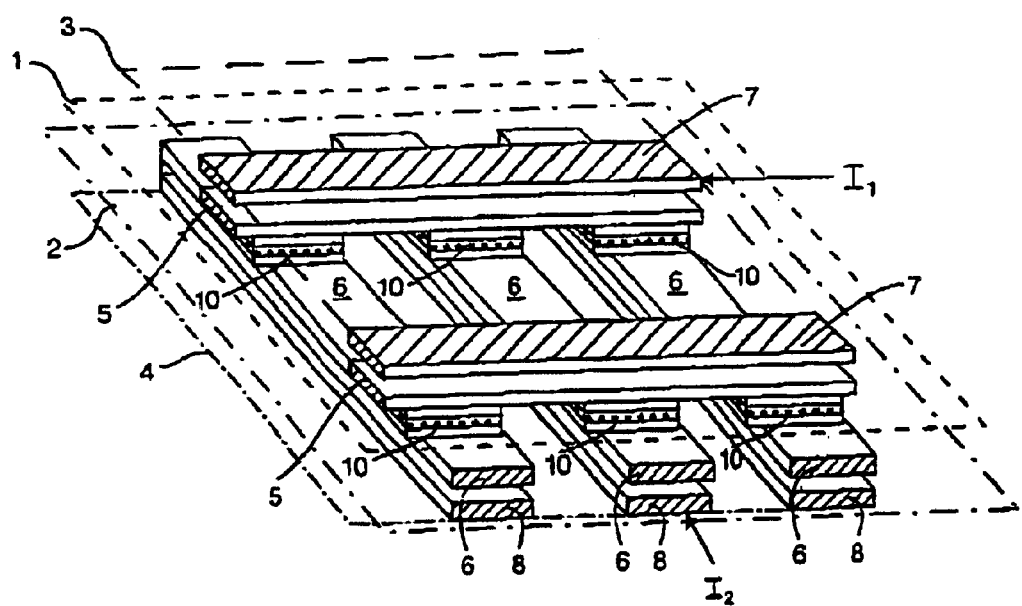
FIG. 1 is perspective view of an exemplary embodiment of an integrated magnetoresistive semiconductor memory configuration.
Figure 2:
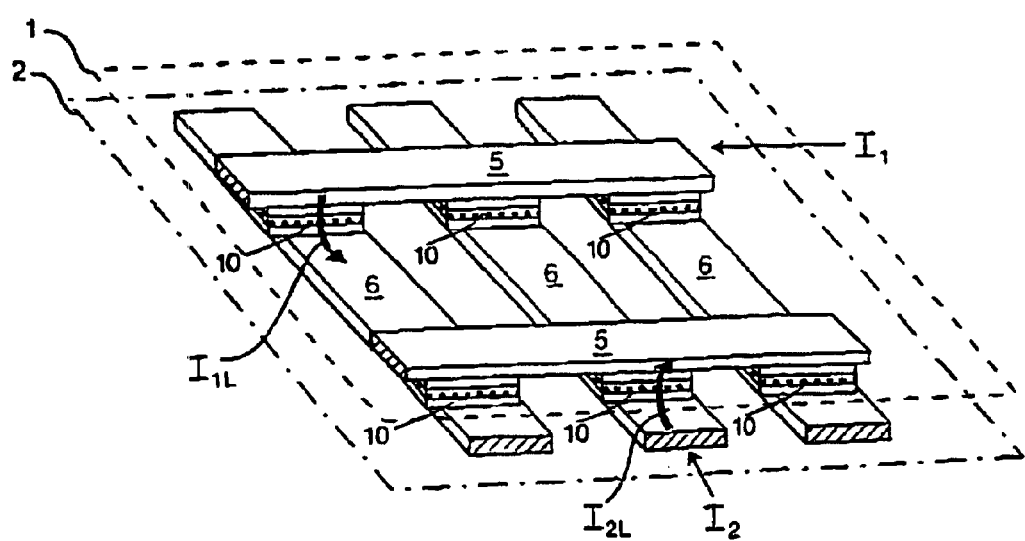
FIG. 2 is perspective view of a prior art integrated magnetoresistive semiconductor memory configuration.

In FIG. 1, which illustrates an exemplary embodiment of the inventive integrated magnetoresistive semiconductor memory configuration, elements that are the same as those shown in FIG. 1 have the same reference numerals as the corresponding elements in FIG. 2.

Referring now to the figures of the drawing in detail and first, particularly, to FIG. 1 thereof, there is shown an exemplary embodiment of an inventive integrated magnetoresistive semiconductor memory configuration. Magnetoresistive memory cells 10 are situated at the crossover points directly between read selection lines 5 and 6 so that the latter have electrical contact with the magnetoresistive memory cells. The read selection lines 5 and 6 are in each case located in an (upper) first line plane 1 and in a (lower) second line plane 2, which are electrically isolated and spatially separated from one another.

Provided above the first line plane 1 is a third line plane 3, in which write selection lines 7 (marked by oblique hatching) are led in a manner spatially separated and electrically isolated from the upper read selection lines 5. Since, in the exemplary embodiment, the write selection lines 7 running in the third line plane 3 are electrically decoupled from the selection lines 5 in the underlying first line plane 1, the voltage drop along the upper selection line 7 through which a write current I1 flows cannot lead to a leakage current through the cell array.

It should be mentioned that the selection lines 7 led in the third line plane 3 do not necessarily have to run parallel to the underlying selection lines 5. Instead, it may be advantageous for the write selection lines 7 to run at a specific angle, for example at an angle of 90°, relative to the underlying selection lines 5. Such an angle may reduce the electrostatic coupling between the selection lines, which otherwise run densely one above the other. Other angles may lead to resulting magnetic fields which possibly have a more favorable spatial orientation.

In addition to the write selection lines 7 running in the third line plane 3, a fourth line plane 4 is provided below the second line plane 2, and additional write selection lines 8 are led in the fourth line plane and, in accordance with the example illustrated, run parallel to the (lower) read selection lines 6. This measure makes it possible to reduce the leakage current to zero. It should be mentioned that in FIG. 1 the (topmost) third line plane 3 and the (bottommost) fourth line plane 4 are electrically decoupled from the embedded structure which corresponds to the customary MRAM cell array shown in FIG. 2. For the purpose of writing to an MRAM memory cell 10, in each case a write current $I_1$ is impressed in one of the upper write selection lines 7 and a write current $I_2$ is impressed in one of the lower write selection lines 8. By virtue of the electrical decoupling of these conductors with respect to the intervening cells, the voltage drop along the write selection lines 7 and 8 through which current flows does not lead to a leakage current through the cell array. Consequently, in accordance with the exemplary embodiment shown in FIG. 1, all the selection lines 7 and 8 serving for writing to the cell array are electrically decoupled from the read selection lines 5 and 6. In this case, the read selection lines 5 and 6 which make direct contact with the MRAM cells continue to be utilized for reading a cell information item. Parallel writing and reading of information items is made possible as a result of this.

In the exemplary embodiment shown in FIG. 1, it is not necessary for the write selection lines 7 and the lower write selection lines 8 in each case to be led parallel to the read selection lines 5 and 6 lying directly below and above them. A specific angle which differs from 0° for example 90° may be advantageous.

The current-voltage characteristic curve through an MRAM memory cell (e.g. MTJ memory cell) is very non-linear and similar to the characteristic curve of a diode. A method for writing to the inventive MRAM memory cell makes use of this property. In addition to a (main) write current impressed in a respective write selection line 7 or 8 in the third or fourth line plane 3 or 4, this method impresses a small additional write current in the selection lines 5 and 6 respectively adjoining the MRAM memory cell. The additional write current must flow in the same direction as the main write current mentioned. The current intensity of the small additional write current may then advantageously be chosen such that the maximum voltage drop established along the selection line adjoining the MRAM cells is in a region of the current-voltage characteristic curve of the MRAM memory cell with high resistance, in other words the leakage current then becomes negligible.

I claim:

1. A method for writing to magnetoresistive memory cells, which comprises:

providing an integrated magnetoresistive semiconductor memory configuration having MRAM memory cells located in a memory cell plane at crossover points between first selection lines embedded in a first line plane directly contacting the MRAM memory cells and second selection lines embedded in a second line plane directly contacting the MRAM memory cells, the second line plane being separate from the first line plane, the first selection lines and the second selection lines for impressing read/write currents for writing information items to the MRAM memory cells and for impressing read/write currents for reading the information items from the MRAM memory cells;

providing the integrated magnetoresistive semiconductor memory configuration with a third line plane being contiguous with one of the first and second line planes and electromagnetically associated with the MRAM memory cells in the memory call plane but spatially separated and electrically isolated from the first line plane and the second line plane;

providing the third line plane with write selection lines for writing a cell information item to the MRAM memory cells in the memory cell plane;

providing the integrated magnetoresistive semiconductor memory configuration with a fourth line plane being contiguous with the other one of the first and second line planes to which the third line plane is not contiguous and electromagnetically associated with the MRAM memory cells in the memory call plane but spatially separated and electrically isolated from the first line plane, the second line plane, and the third line plane;

providing the fourth line plane with write selection lines for writing a cell information item to the MRAM memory cells in the memory cell plane;

impressing a main write current in a direction through one of the write selection lines in the third line plane and through one of the write selection lines in the fourth line plane for writing to a particular one of the MRAM cells, while also impressing an additional write current through one of the first selection lines adjoining the particular one of MRAM memory cells and through one of the second selection lines adjoining the particular one of MRAM memory cells; and when impressing the additional write current, impressing the additional write current being small compared to the main write current and in the same direction as the main write current in the write selection line in the respectively contiguous third and fourth line plane.

2. The method according to claim 1, which further comprises:

when impressing the additional write current, setting a current intensity of the additional write current such that a maximum voltage drop is established along the one of the first selection lines adjoining the particular one of MRAM memory cells and along the one of the second selection lines adjoining the particular one of MRAM memory cells;

defining a current-voltage characteristic curve of the particular one of MRAM memory cells such that the current-voltage characteristic curve has a region of high resistance and a region of low resistance; and ensuring that the maximum voltage drop lies in the region of high resistance in the current-voltage characteristic curve of the particular one of MRAM memory cells.

* * * * *